United States Patent
Hoppner et al.

(10) Patent No.: US 7,804,342 B2
(45) Date of Patent: Sep. 28, 2010

(54) DIFFERENTIAL SIGNAL DRIVEN DIRECT-CURRENT VOLTAGE GENERATING DEVICE

(75) Inventors: Sebastian Hoppner, Taipei (TW); Zuo-Min Tsai, Taipei (TW); Huie Wang, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 12/390,885

(22) Filed: Feb. 23, 2009

(65) Prior Publication Data

US 2010/0073050 A1 Mar. 25, 2010

(30) Foreign Application Priority Data

Sep. 23, 2008 (TW) .............................. 97136411 A

(51) Int. Cl.
*H03L 7/06* (2006.01)
(52) U.S. Cl. ...................... 327/156; 327/147
(58) Field of Classification Search ................ 327/148, 327/149, 157, 158
See application file for complete search history.

(56) References Cited

U.S. PATENT DOCUMENTS

| | | | | |
|---|---|---|---|---|
| 4,736,167 A | * | 4/1988 | Kojima et al. | 331/17 |
| 6,437,609 B1 | * | 8/2002 | Chehadi | 327/102 |
| 7,622,946 B2 | * | 11/2009 | Abadeer et al. | 326/30 |
| 2006/0139074 A1 | * | 6/2006 | Doi | 327/157 |
| 2008/0122505 A1 | * | 5/2008 | Wu | 327/157 |
| 2009/0174441 A1 | * | 7/2009 | Gebara et al. | 327/115 |

* cited by examiner

*Primary Examiner*—Lincoln Donovan
*Assistant Examiner*—Adam D Houston
(74) *Attorney, Agent, or Firm*—Peter F. Corless; Steven M. Jensen; Edwards Angell Palmer & Dodge LLP

(57) ABSTRACT

A differential signal driven direct-current voltage generating device is proposed, which is designed for use with a PLL (phase-locked loop) circuit or a DLL (delay-locked loop) circuit system for generating an output of a direct-current (DC) voltage in response to a pair of differential signals, such as phase-difference signals; and which is characterized by the utilization of a capacitor-switched voltage doubler for doubling the output voltage of a charge pump so that the doubled voltage can be used as a control voltage for a PLL-VCO (voltage-controlled oscillation) or a DLL-VCDL (voltage-controlled delay line) circuit for generation of an output oscillating signal with a wider frequency range.

19 Claims, 5 Drawing Sheets

DIFFERENTIAL SIGNAL DRIVEN DIRECT-CURRENT VOLTAGE GENERATING DEVICE

BACKGROUND OF THE INVENTION

1. Field of the Invention

This invention relates to electronic circuit technology, and more particularly, to a differential signal driven direct-current (DC) voltage generating device which is designed for integration to a PLL (phase-locked loop) or a DLL (delay-locked loop) circuit system for generating an output of a DC voltage in response to an input of a differential signal, such as a phase-difference signal.

2. Description of Related Art

In PLL (phase-locked loop) and DLL (delay-locked loop) circuitry, the charge pump is an essential circuit component capable of being driven by a pair of phase-difference signals (which respectively indicate the lagging or leading of the output frequency generated by the PLL or DLL circuitry with respect to a reference frequency) and responsively generating an output of a DC voltage whose amplitude is proportional to the phase difference between the output frequency and the reference frequency. Fundamentally, the lagging of the output frequency against the reference frequency will result in a negative phase-difference signal which is presented as a pump-up enable signal (UP) to the charge pump; whereas the leading of the output frequency will result in a positive phase-difference signal which is presented as a pump-down enable signal (DN) to the charge pump. The output of the charge pump is a DC voltage which is subsequently used as a control voltage for a VCO (voltage-controlled oscillation) circuit for adjusting its output frequency to match in phase with the reference frequency.

Theoretically, the output frequency range of a PLL-VCO circuit is proportional to the amplitude range of the input control voltage, i.e., the output DC voltage range of the charge pump. Accordingly, if we want to increase the PLL-VCO output frequency range, it can be achieved by increasing the output voltage range of the charge pump.

In practice, however, traditional charge pump circuits are only capable of offering a limited output voltage range; and therefore, the VCO circuits are also only capable of offering a limited range of output frequencies in proportion to the charge pump voltages.

In view of the foregoing problem, there exists therefore a need in the electronics industry for a new circuit technology that allows PLL/DLL circuit systems to offer a wider range of output frequencies.

SUMMARY OF THE INVENTION

It is therefore an objective of this invention to provide a differential signal driven direct-current voltage generating device that can generate an output of a DC voltage with a wider range that can be used for driving PLL or DLL circuit systems to produce a wider range of output frequencies.

The differential signal driven direct-current voltage generating device according to the invention is designed for integration to a PLL (phase-locked loop) or a DLL (delay-locked loop) circuit system for generating an output of a DC voltage in response to an input of a differential signal, such as a phase-difference signal.

In architecture, the differential signal driven direct-current voltage generating device of the invention comprises: (A) a charge pump unit; (B) a loop filter unit; (C) a voltage doubler unit; and (D) a spur filter unit.

The differential signal driven direct-current voltage generating device according to the invention is characterized by the utilization of a capacitor-switched voltage doubler for doubling the output voltage of a charge pump so that the doubled voltage can be used as a control voltage for a PLL-VCO (voltage-controlled oscillation) or a DLL-VCDL (voltage-controlled delay line) circuit for generation of an output oscillating signal with a wider frequency range.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The differential signal driven direct-current voltage generating device according to the invention is disclosed in full details by way of preferred embodiments in the following with reference to the accompanying drawings.

Function of the Invention

Figure 1:
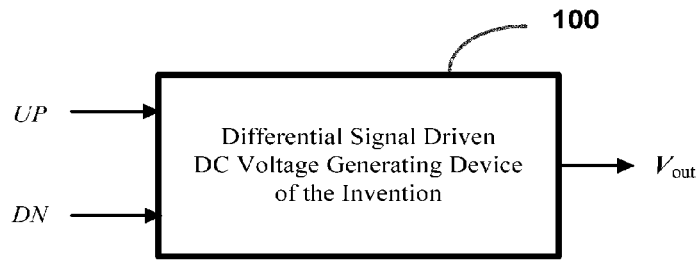
FIG. 1 is a schematic diagram showing the I/O functional model of the DC voltage generating device of the invention.

FIG. 1 is a schematic diagram showing the input/output (I/O) functional model of the differential signal driven direct-current (DC) voltage generating device according to the invention (which is here encapsulated in a box indicated by the reference numeral 100, and is hereinafter referred in short as "DC voltage generating device"). As shown, the DC voltage generating device of the invention 100 is designed with an I/O interface having a pair of input ports (UP, DN) and an output port ($V_{out}$), where the input ports (UP, DN) are used for reception of a pair of differential signals, such as a pair of phase-difference signals, which are presented respectively as a pump-up enable signal (UP) and a pump-down enable signal (DN); while the output port ($V_{out}$) is used to output a DC voltage whose amplitude will be pumped up to a higher level at the presence of the pump-up enable signal (UP) and pumped down to a lower level at the presence of the pump-down enable signal (DN).

Application of the Invention

Figure 2A:
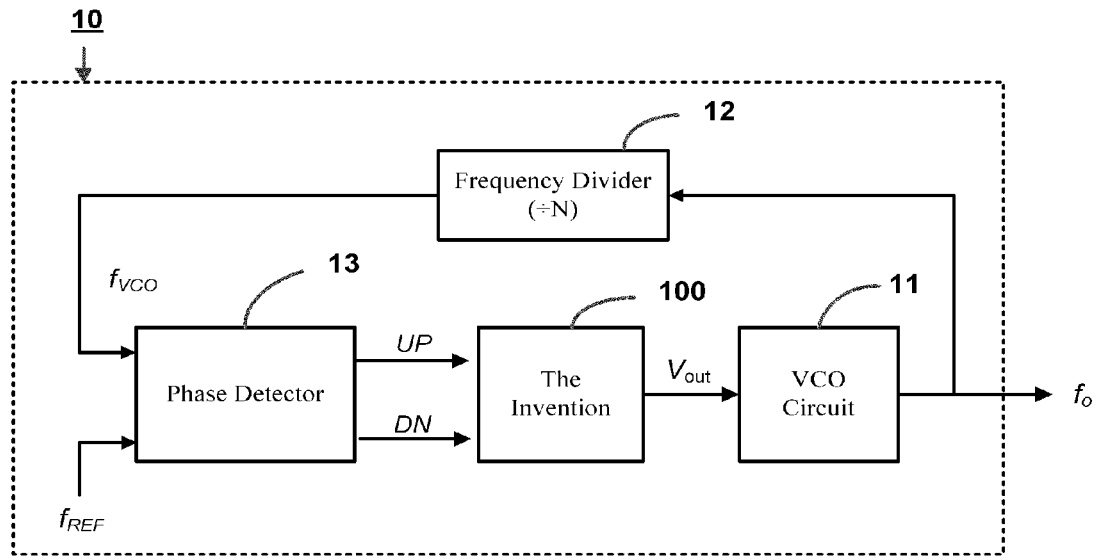
FIG. 2A is a schematic diagram showing a first application example of the DC voltage generating device of the invention.
Figure 2B:
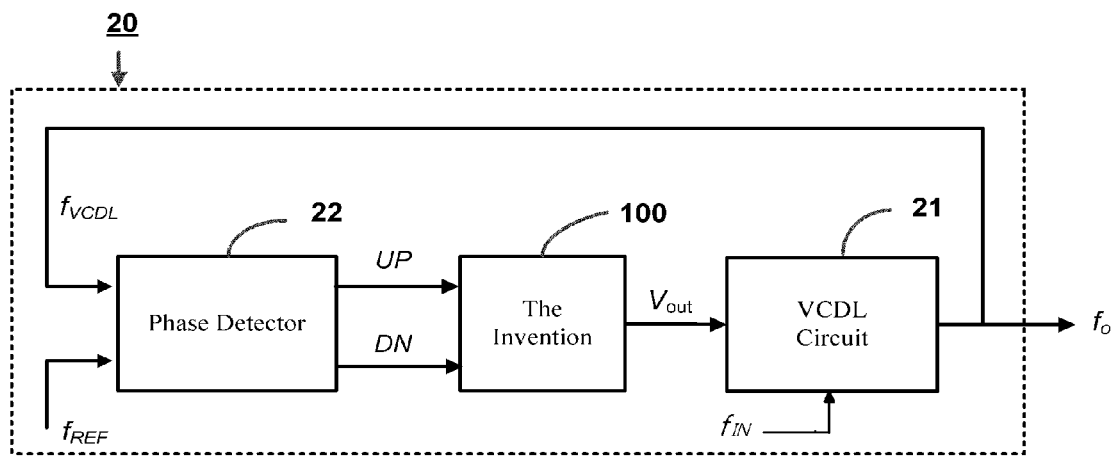
FIG. 2B is a schematic diagram showing a second application example of the DC voltage generating device of the invention.

FIGS. 2A-2B show two application examples of the DC voltage generating device of the invention 100, respectively with a PLL (phase-locked loop) shown in FIG. 2A and a DLL (delay-locked loop) circuit system shown in FIG. 2B.

As shown in FIG. 2A, in the first application example, the DC voltage generating device of the invention 100 is integrated as a circuit component to a PLL circuit system 10 which additionally includes a VCO (voltage-controlled oscillation) circuit 11, a frequency divider 12, and a phase detector 13. In operation, the output frequency signal $f_o$ of the PLL circuit system 10 is first divided by the frequency divider 12 to obtain $f_{vco}$ and then fed back to the phase detector 13 for phase comparison against a reference signal $f_{REF}$ to thereby generate a pair of phase-difference signals, including a negative phase-difference signal (which indicates $f_{vco}$ lags in phase against $f_{REF}$) and a positive phase-difference signal (which indicates $f_{vco}$ leads in phase against $f_{REF}$). The negative phase-difference signal is then outputted as a pump-up enable signal (UP) and the positive phase-difference signal is outputted as a pump-down enable signal (DN) to the DC voltage generating device of the invention 100. In response, the DC voltage generating device of the invention 100 will generate an output of a DC voltage $V_{out}$ whose amplitude is proportional to the phase difference between $f_{vco}$ and $f_{REF}$, and then the output voltage $V_{out}$ is used as a control voltage for the VCO circuit 11 to generate an output signal whose frequency is matched in phase to the reference signal $f_{REF}$. Since PLL is a well-known circuit technology in the electronics industry, detailed description thereof will not be given in this specification.

As shown in FIG. 2B, in the second application example, the DC voltage generating device of the invention 100 is integrated as a circuit component to a DLL circuit system 20 which additionally includes a VCDL (voltage-controlled delay line) circuit 21 and a phase detector 22. In operation, the output frequency signal $f_{VCDL}$ of the VCDL circuit 21 is used as the output $f_o$ of the DLL circuit system 20, and which is fed back to the phase detector 22 for phase comparison against a reference signal $f_{REF}$ to thereby generate a pair of phase-difference signals. The negative phase-difference signal is then outputted as a pump-up enable signal (UP) and the positive phase-difference signal is outputted as a pump-down enable signal (DN) to the DC voltage generating device of the invention 100. In response, the DC voltage generating device of the invention 100 will generate an output of a DC voltage $V_{out}$ whose amplitude is proportional to the phase difference between $f_o$ and $f_{REF}$, and then the output DC voltage $V_{out}$ is used as a control voltage for the VCDL circuit 21 to generate an output signal of a proportional delay. Since DLL is a well-known circuit technology in the electronics industry, detailed description thereof will not be given in this specification

Architecture of the Invention

Figure 3:
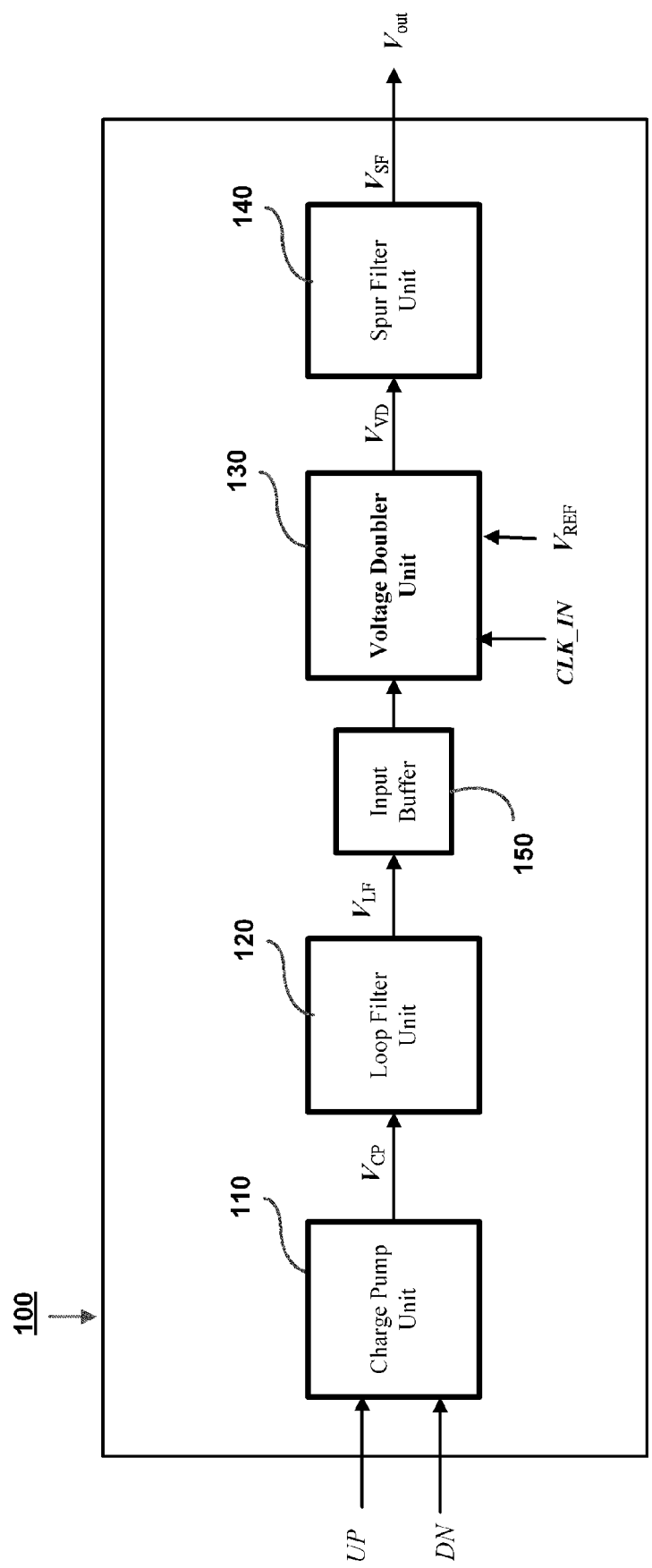
FIG. 3 is a schematic diagram showing the circuit architecture of the DC voltage generating device of the invention.

As shown in FIG. 3, in circuit architecture, the DC voltage generating device of the invention 100 comprises: (A) a charge pump unit 110; (B) a loop filter unit 120; (C) a voltage doubler unit 130; and (D) a spur filter unit 140. Firstly, the respective attributes and functions of these constituent circuit components of the invention are described in details in the following.

Charge Pump Unit 110

The charge pump unit 110 is capable of being driven by the input pump-up enable signal (UP) and the pump-down enable signal (DN) for generation of an output of a charge-pump voltage $V_{cp}$. In practical application, for example, the pump-up enable signal (UP) and the pump-down enable signal (DN) are derived respectively from a negative phase-difference signal and a positive phase-difference signal which are outputted from a phase detector.

Figure 4:
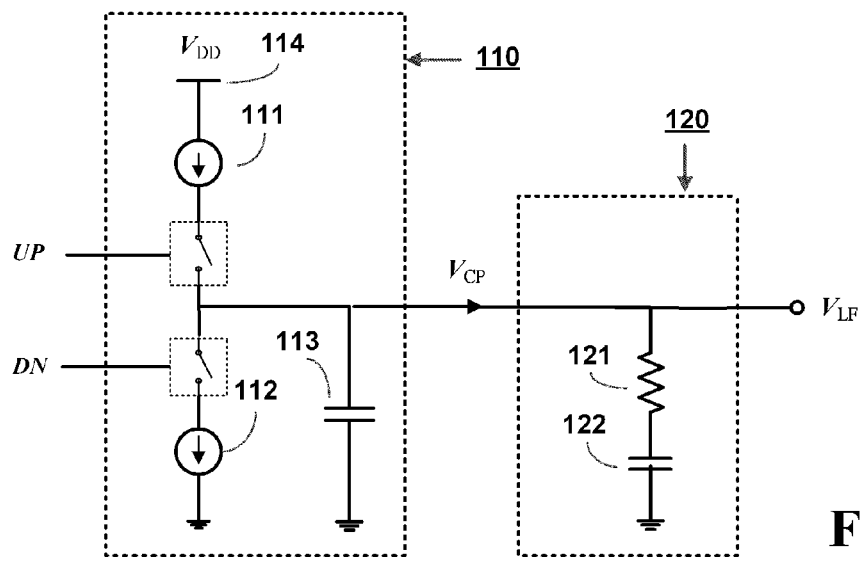
FIG. 4 is a circuit diagram showing the internal circuit architecture of a charge pump unit and a loop filter unit used to construct the DC voltage generating device of the invention.

In practice, for example, this charge pump unit 110 can be implemented with a current-driven circuit structure shown in FIG. 4, which is composed of a charging current source 111, a discharging current source 112, a capacitor 113, and a driving voltage ($V_{DD}$) 114. In operation, the charging current source 111 can be switchably enabled by the pump-up enable signal UP (i.e., when UP is logic-HIGH state) to perform a current charging operation on the phase detector 13, while the discharging current source 112 can be switchably enabled by the pump-down enable signal DN (i.e., when DN is logic-HIGH state) for performing a current discharging operation on the phase detector 13. The net charge on the phase detector 13 then results in a capacitive voltage which is fetched as the output voltage $V_{cp}$ of the charge pump unit 110.

Loop Filter Unit 120

The loop filter unit 120 is a low-pass filter which is capable of performing a loop filtering operation on the output voltage $V_{cp}$ of the charge pump unit 110 to thereby generate an output voltage $V_{LF}$ which is a smoothed version of $V_{cp}$.

In practice, the loop filter unit 120 can be implemented with various different types of filter circuits. One preferred embodiment of the loop filter unit 120 is shown in FIG. 4, which is implemented with an RC (resistance-capacitance) circuit composed of a resistor 121 and a capacitor 122.

Voltage Doubler Unit 130

The voltage doubler unit 130 has an input port (IN) and an output port (OUT), wherein the input port (IN) is used for reception of the output voltage $V_{LF}$ of the loop filter unit 120, while the output port (OUT) is used for generation of an output voltage $V_{VD}$ whose amplitude is two folds of $V_{LF}$, i.e., $V_{VD}=2*V_{LF}$. The output voltage $V_{VD}$ is then transferred to the spur filter unit 140.

Figure 5:
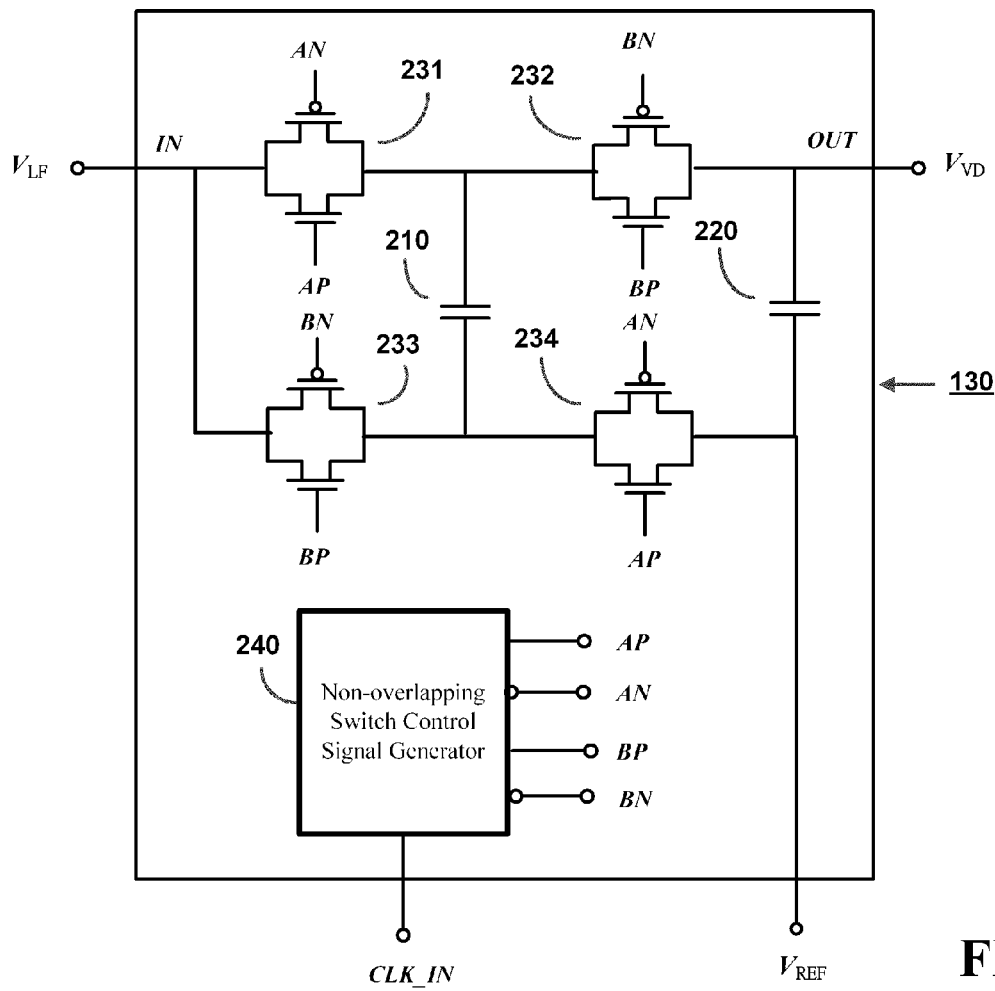
FIG. 5 is a circuit diagram showing the internal circuit architecture of a voltage doubler unit used to construct the DC voltage generating device of the invention.

In practice, for example, this voltage doubler unit 130 can be implemented with a switched-capacitor circuit structure shown in FIG. 5, which is composed of the following circuit components: (i) a first capacitor ($C_1$) 210; (ii) a second capacitor ($C_2$) 220; (iii) an array of switches, including a first switch 231, a second switch 232, a third switch 233, and a fourth switch 234; and (iv) a non-overlapping switch control signal generator 240. As shown in FIG. 5, the four switches 231, 232, 233, 234 can be each implemented with a transmission gate circuit composed of a PMOS transistor and an NMOS transistor.

Figure 8:
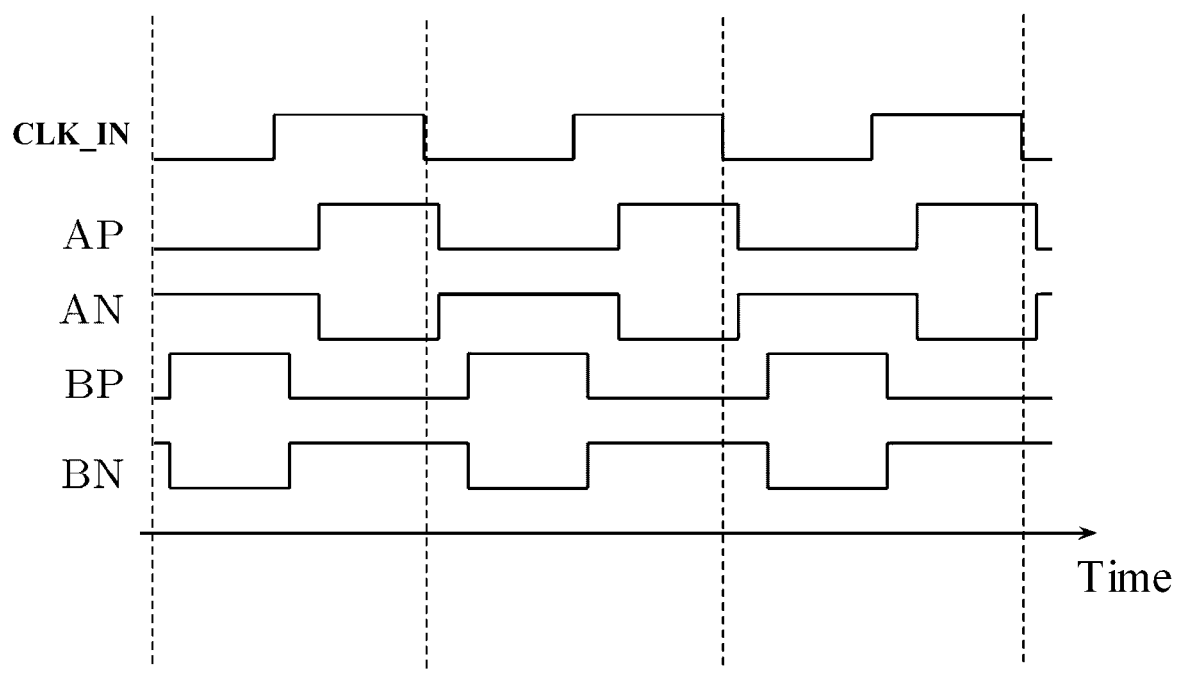
FIG. 8 is a signal diagram showing the waveform and sequencing of a number of control signals used to drive the voltage doubler unit shown in FIG. 5.

During actual operation, the switch control signal generator 240 is driven by a clock signal CLK_IN for generating a set of switch control signals [AP, AN, BP, BN] whose waveforms and sequencing are shown in FIG. 8. These switch control signals [AP, AN, BP, BN] are then used respectively to control the ON/OFF state of each of the four switches 231, 232, 233, 234, whereby the first capacitor ($C_1$) 210 and the second capacitor ($C_2$) 220 are switchably connected to a reference voltage $V_{REF}$ and thereby double the amplitude of the received voltage $V_{LF}$ at the input port (IN). The output voltage $V_{VD}$ is then transferred via the output port (OUT) to the spur filter unit 140.

Figure 6:
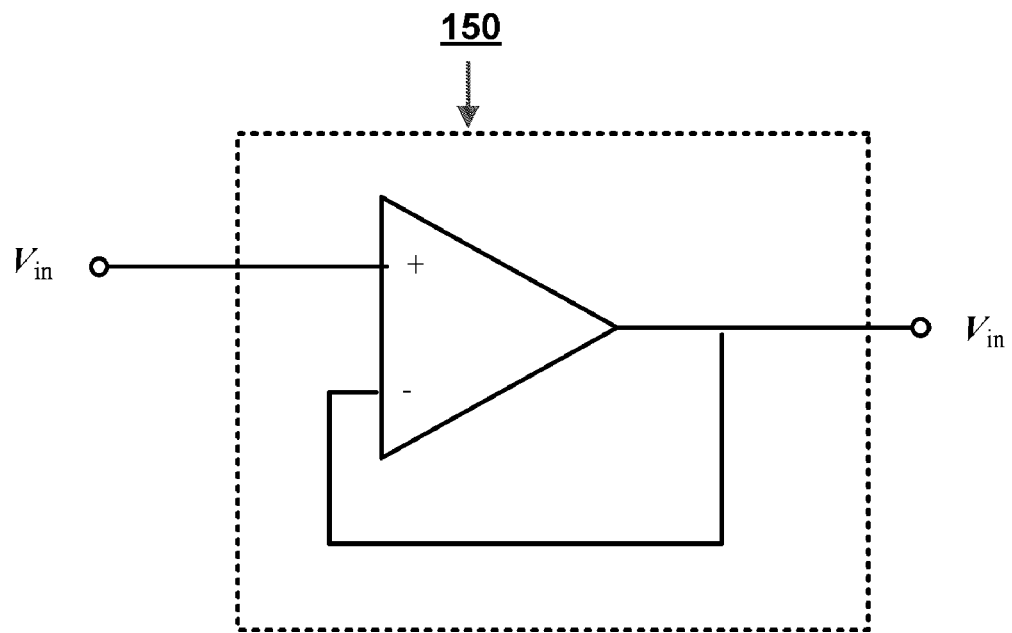
FIG. 6 is a circuit diagram showing the internal circuit architecture of an input buffer used to construct the DC voltage generating device of the invention.

In another embodiment, the input port (IN) of the voltage doubler unit 130 can be coupled to an input buffer 150 for providing a buffer effect to the output voltage $V_{LF}$ of the loop filter unit 120. In practice, for example, the input buffer 150 can be implemented with a negative-feedback operational amplifier whose circuit structure is shown in FIG. 6.

Spur Filter Unit 140

The spur filter unit 140 is capable of performing a spur filtering operation on the output voltage $V_{VD}$ of the voltage doubler unit 130 to thereby generate a spur filtered output voltage $V_{SF}$ serving as the end result output of the DC voltage generating device of the invention 100, i.e., $V_{out}=V_{SF}$.

Figure 7:
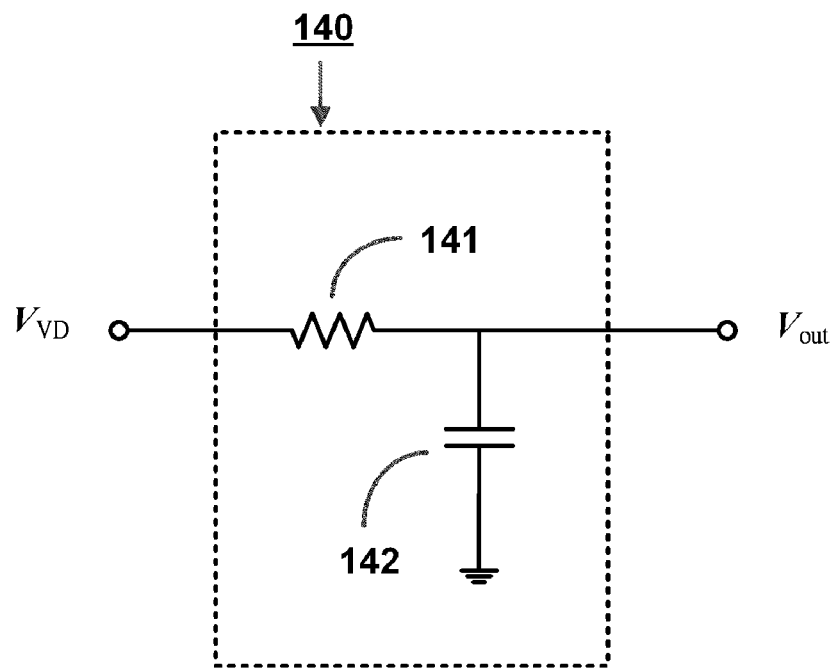
FIG. 7 is a circuit diagram showing the internal circuit architecture of a spur filter unit used to construct the DC voltage generating device of the invention.

In practice, for example, the spur filter unit 140 can be implemented with various different types of filter circuits. One preferred embodiment of the spur filter unit 140 is shown in FIG. 7, which is implemented with an RC (resistance-capacitance) circuit composed of a resistor 141 and a capacitor 142.

Operation of the Invention

In practical applications, the DC voltage generating device of the invention 100 is used to generate an output of a DC voltage for PLL control of the PLL circuit system 10 shown in FIG. 2A or for DLL control of the DLL circuit system 20 shown in FIG. 2B.

The following is a detailed description of an application example of the DC voltage generating device of the invention 100 with the PLL circuit system 10 shown in FIG. 2A. In this case, the feedback frequency $f_{VCO}$ is compared in phase against the reference signal $f_{REF}$, and the phase difference between $f_{VCO}$ and $f_{REF}$ results in the generation of either a pump-up enable signal (UP) or a pump-down enable signal (DN).

In response to UP or DN, the charge pump unit 110 generates an output of a charge-pump voltage $V_{cp}$ whose amplitude is proportional to the phase difference between $f_{VCO}$ and $f_{REF}$. The charge pump voltage $V_{cp}$ is then transferred to the loop filter unit 120.

Next, the output voltage $V_{cp}$ of the charge pump unit 110 passes through the loop filter unit 120, resulting in an output voltage $V_{LF}$ which is a smoothed version of $V_{cp}$. The output voltage $V_{LF}$ is then transferred to the voltage doubler unit 130.

Subsequently, the voltage doubler unit 130 performs an amplitude doubling operation on the received voltage $V_{LF}$ for generation of an output voltage $V_{VD}$ whose amplitude is two folds of $V_{LF}$, i.e., $V_{VD}=2*V_{LF}$. The output voltage $V_{VD}$ is then transferred to the spur filter unit 140.

Next, the output voltage $V_{VD}$ of the voltage doubler unit 130 passes through the spur filter unit 140, resulting in a spur filtered output voltage $V_{SF}$, which is used to serve as the end result output voltage $V_{out}$ of the DC voltage generating device of the invention 100.

The output voltage $V_{out}$ of the DC voltage generating device of the invention 100 is then used to serve as a control voltage for the VCO circuit 11 of the PLL circuit system 10 shown in FIG. 2A, so that the output frequency $f_o$ is adjusted to match in phase with the reference signal $f_{REF}$.

Performance of the Invention

In comparison with prior art, the DC voltage generating device of the invention 100 is capable of providing an amplitude-doubled DC control voltage for the VCO circuit 11 in the PLL circuit system 10 or for the VCDL circuit 21 in the DLL circuit system 20. This feature allows the PLL or DLL circuit systems to operate with a doubled range of control voltages to provide a doubled range of output frequencies. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A differential signal driven direct-current voltage generating device for integration to a circuit system for generating an output of a direct-current (DC) voltage in response to a pump-up enable signal and a pump-down enable signal, which comprises:
   a charge pump unit, which is capable of being driven by the pump-up enable signal and the pump-down enable signal to generate an output of a charge pump voltage;
   a loop filter unit, which is capable of performing a loop filtering operation on the output of the charge pump unit to thereby generate an output of a loop-filtered voltage;
   a voltage doubler unit, which is capable of performing an amplitude doubling operation on the output of the loop filter unit to thereby generate an output of an amplitude doubled voltage; and
   a spur filter unit, which is capable of performing a spur filtering operation on the output of the voltage doubler unit to thereby generate a spur filtered voltage which is used to serve as the output of the differential signal driven direct-current voltage generating device.

2. The differential signal driven direct-current voltage generating device of claim 1, wherein the circuit system is a PLL (phase-locked loop) circuit system.

3. The differential signal driven direct-current voltage generating device of claim 1, wherein the circuit system is a DLL (delay-locked loop) circuit system.

4. The differential signal driven direct-current voltage generating device of claim 1, wherein the charge pump unit is a current-driven type of charge pump.

5. The differential signal driven direct-current voltage generating device of claim 1, wherein the loop filter unit is an RC (resistance-capacitance) circuit.

6. The differential signal driven direct-current voltage generating device of claim 1, wherein the voltage doubler unit is a switched-capacitor type of voltage doubler.

7. The differential signal driven direct-current voltage generating device of claim 1, further comprising an input buffer coupled to the input side of the voltage doubler unit.

8. The differential signal driven direct-current voltage generating device of claim 7, wherein the input buffer is a negative-feedback operational amplifier.

9. The differential signal driven direct-current voltage generating device of claim 1, wherein the spur filter unit is an RC (resistance-capacitance) circuit.

10. A differential signal driven direct-current voltage generating device for integration to a circuit system for generating an output of a direct-current (DC) voltage in response to a pump-up enable signal and a pump-down enable signal, which comprises:
    a charge pump unit, which is capable of being driven by the pump-up enable signal and the pump-down enable signal to generate an output of a charge pump voltage;
    a voltage doubler unit, which is capable of performing an amplitude doubling operation on the output of the charge pump unit to thereby generate an output of an amplitude doubled voltage which is used to serve as the output of the differential signal driven direct-current voltage generating device.

11. The differential signal driven direct-current voltage generating device of claim 10, wherein the circuit system is a PLL (phase-locked loop) circuit system.

12. The differential signal driven direct-current voltage generating device of claim 10, wherein the circuit system is a DLL (delay-locked loop) circuit system.

13. The differential signal driven direct-current voltage generating device of claim 10, wherein the charge pump unit is a current-driven type of charge pump.

14. The differential signal driven direct-current voltage generating device of claim 10, wherein the loop filter unit is an RC (resistance-capacitance) circuit.

15. The differential signal driven direct-current voltage generating device of claim 10, wherein the voltage doubler unit is a switched-capacitor type of voltage doubler.

16. The differential signal driven direct-current voltage generating device of claim 10, wherein the spur filter unit is an RC (resistance-capacitance) circuit.

17. A differential signal driven direct-current voltage generating device for integration to a PLL (phase-locked loop) circuit system having a VCO (voltage-controlled oscillation) circuit, a frequency divider, and a phase detector, for generating an output of a direct-current (DC) voltage in response to a pump-up enable signal and a pump-down enable signal from the phase detector;

the differential signal driven direct-current voltage generating device comprising:

a charge pump unit, which is capable of being driven by the pump-up enable signal and the pump-down enable signal to generate an output of a charge pump voltage;

a loop filter unit, which is capable of performing a loop filtering operation on the output of the charge pump unit to thereby generate an output of a loop-filtered voltage;

a voltage doubler unit, which is capable of performing an amplitude doubling operation on the output of the loop filter unit to thereby generate an output of an amplitude doubled voltage; and a spur filter unit, which is capable of performing a spur filtering operation on the output of the voltage doubler unit to thereby generate a spur filtered voltage which is used to serve as the output of the differential signal driven direct-current voltage generating device.

18. The differential signal driven direct-current voltage generating device of claim 17, wherein the charge pump unit is a current-driven type of charge pump.

19. The differential signal driven direct-current voltage generating device of claim 17, wherein the voltage doubler unit is a switched-capacitor type of voltage doubler.

* * * * *